United States Patent
Cho et al.

(10) Patent No.: US 11,741,816 B2
(45) Date of Patent: Aug. 29, 2023

(54) ELECTRONIC DEVICE HAVING SELF-DIAGNOSIS FUNCTION

(71) Applicant: LG ELECTRONICS INC., Seoul (KR)

(72) Inventors: Han Jin Cho, Seoul (KR); Gwang Mi Go, Seoul (KR); Byung Hyun An, Seoul (KR)

(73) Assignee: LG ELECTRONICS INC., Seoul (KR)

(*) Notice: Subject to any disclaimer, the term of this patent is extended or adjusted under 35 U.S.C. 154(b) by 79 days.

(21) Appl. No.: 17/597,731

(22) PCT Filed: Jul. 29, 2019

(86) PCT No.: PCT/KR2019/009375
§ 371 (c)(1),
(2) Date: Jan. 20, 2022

(87) PCT Pub. No.: WO2021/020601
PCT Pub. Date: Feb. 4, 2021

(65) Prior Publication Data
US 2022/0262229 A1 Aug. 18, 2022

(51) Int. Cl.
G08B 21/18 (2006.01)
G01R 19/165 (2006.01)

(52) U.S. Cl.
CPC ..... *G08B 21/185* (2013.01); *G01R 19/16576* (2013.01)

(58) Field of Classification Search
CPC .................................................. G08B 21/185
See application file for complete search history.

(56) References Cited

U.S. PATENT DOCUMENTS

| | | | | |
|---|---|---|---|---|
| 4,249,170 A | * | 2/1981 | Cham | H02H 1/0038 361/37 |
| 2021/0215772 A1 | * | 7/2021 | Mauney | G01R 31/52 |

* cited by examiner

*Primary Examiner* — Travis R Hunnings
(74) *Attorney, Agent, or Firm* — LEE, HONG, DEGERMAN, KANG & WAIMEY PC (57) ABSTRACT

An electronic device having a self-diagnosis function is proposed. In the electronic device, a fault detector is provided on a primary side of a power board, so that fault states of a main board and a load may be detected even when the main board is broken or power is not applied to the main board. In addition, as long as commercial alternating power is input, even in a state where a power switch is turned off, the electronic device is supplied with the power, so that various types of faults in the main board and the load may be detected.

20 Claims, 6 Drawing Sheets

ELECTRONIC DEVICE HAVING SELF-DIAGNOSIS FUNCTION

CROSS-REFERENCE TO RELATED APPLICATIONS

This application is the National Stage filing under 35 U.S.C. 371 of International Application No. PCT/KR2019/009375, filed on Jul. 29, 2019, the contents of which are all incorporated by reference herein in its entirety.

TECHNICAL FIELD

The present disclosure relates to an electronic device having a self-diagnosis function and, more particularly, to an electronic device capable of self-detecting a fault state.

BACKGROUND ART

Among currently mass-produced home appliances and electronic products, there are products having a function of self-diagnosing faults. The function capable of self-diagnosing faults may be usefully utilized when mass-producing products or when the products are used by consumers. For example, in a case of a product fault, the self-diagnosis function is useful to both consumers and service engineers in that after-sales service may be proceeded by confirming specific faults through the self-diagnosis function before calling a service engineer, and by confirming after-sales service availability, cost, and necessary parts, and the like in advance.

Such self-fault detection of conventional electronic devices is performed by a microcontroller of a main board or is managed in a circuit equivalent to the microcontroller. Since the main board operates by receiving power supplied from a power board, a self-fault detection function may only be performed when the power is supplied to the main board.

Meanwhile, the power board is divided into a primary side power supply and a secondary side power supply. In order to supply power to the main board, the power should be supplied to a secondary side of the power board. Accordingly, in the related art, only in a state where power is supplied to the secondary side of the power board and the power is supplied to the main board, the fault detection is possible in an electronic device.

However, when the main board is normal, there is no problem with the fault detection function, but there occurs a problem that the electronic device is unable to perform the self-fault detection function when the main board is broken or the main board is not supplied with power.

DISCLOSURE

Technical Problem

An objective of the present disclosure for solving the problems is to provide an electronic device having a self-diagnosis function capable of detecting a fault state of the electronic device even when a main board is broken or the main board is not supplied with power. In addition, another objective of the present disclosure for solving the problems is to provide an electronic device capable of detecting a fault state of the electronic device as long as commercial alternating current power is applied without supplying power to a secondary side of a power board. In addition, yet another objective of the present disclosure for solving the problems is to provide an electronic device having a self-diagnosis function for detecting various faults by using a fault detector provided in a digital power chip, and outputting fault messages by using light or audio in response to the detected fault state.

Technical Solution

In order to solve the problems as described above, in an electronic device having a self-diagnosis function according to an exemplary embodiment of the present disclosure, a fault detector may be provided on a primary side of a power board, so that fault states of a main board and a load may be detected even when the main board is broken or power is not applied to the main board.

In order to solve the problems as described above, in the electronic device having the self-diagnosis function according to the exemplary embodiment of the present disclosure, a fault detector may be provided on a digital power chip on the primary side of the power board, and as long as commercial alternating current power is input, the electronic device may receive power from a filter/rectifier even when a power switch is turned off, and detect various fault types in the main board and the load.

In order to solve the problems as described above, in the electronic device having the self-diagnosis function according to the exemplary embodiment of the present disclosure, fault messages for various fault types detected by the fault detector may be output to at least one of a light-emitting device, a buzzer, and a speaker.

Advantageous Effects

As described above, the electronic device having the self-diagnosis function according to the present disclosure may detect a fault state of the electronic device even when the main board is broken or the main board is not supplied with power. In addition, the electronic device having the self-diagnosis function according to the present disclosure may detect a fault state of the electronic device as long as commercial alternating current power is applied without supplying power to the secondary side of the power board. In addition, the electronic device having the self-diagnosis function according to the present disclosure may detect various faults by using the fault detector provided in the digital power chip of the power board. In addition, the electronic device having the self-diagnosis function according to the present disclosure outputs the fault messages by using a light-emitting device, a buzzer, or a speaker in response to the detected fault state, whereby a user may easily recognize a fault type or fault state.

MODE FOR INVENTION

Hereinafter, specific exemplary embodiments of the present disclosure will be described with reference to the drawings.

Advantages and features of the present disclosure, and a method of achieving them will become apparent with reference to the exemplary embodiments described below in detail together with the accompanying drawings. However, the present disclosure is not limited to the exemplary embodiments disclosed below, but will be implemented in a variety of different forms. These exemplary embodiments are provided only to complete the disclosure of the present disclosure and to completely inform the scope of the present disclosure to those skilled in the art to which the present disclosure pertains, and the present disclosure is only defined by the scope of the claims. Like reference numerals generally denote like elements throughout the present disclosure.

Figure 1:
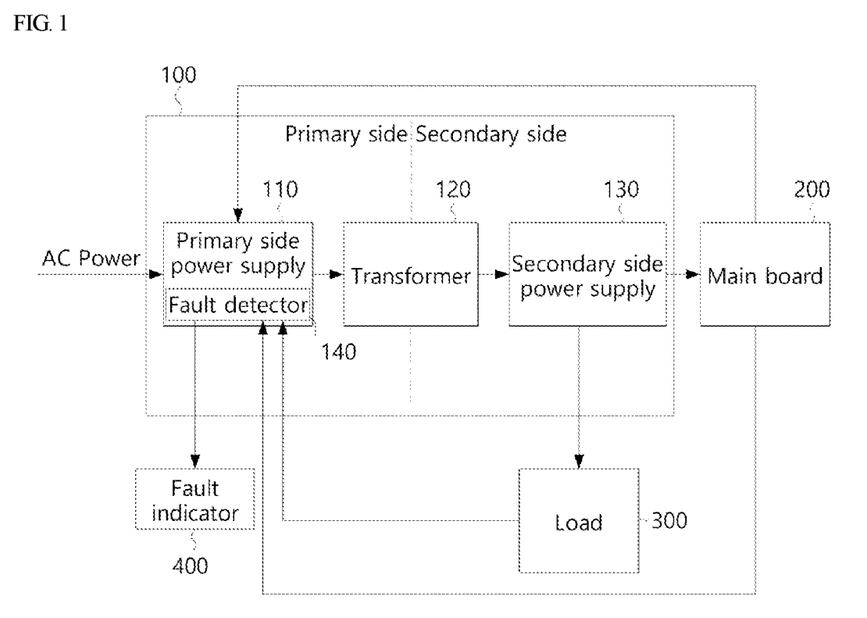
FIG. 1 is a block diagram illustrating an example of an electronic device having a self-diagnosis function according to an exemplary embodiment of the present disclosure.

FIG. 1 is a block diagram illustrating an example of an electronic device having a self-diagnosis function according to the exemplary embodiment of the present disclosure. Referring to FIG. 1, the electronic device having the self-diagnosis function according to the exemplary embodiment of the present disclosure includes a power board 100, a main board 200, a load 300, and a fault detector 140.

The power board 100 is for receiving alternating current power from outside, converting the alternating current power into power to drive each module of the electronic device, and supplying the power, and includes a primary side power supply 110, a transformer 120, and a secondary side power supply 130.

The primary side power supply 110 receives alternating current (AC) power from the outside and applies the AC power to a primary side of the transformer 120 after undergoing rectification and smoothing into direct current (DC) power. The primary side power supply 110 is configured to include a rectification circuit, a power factor correction circuit, and the like, in addition to a filter for removing noise from input commercial AC power.

The transformer 120 converts power input to the primary side to a predetermined magnitude and induces the power to the secondary side. The transformer 120 steps down power input to a primary winding according to a turns ratio and outputs the power to the secondary side.

The secondary power supply 130 is connected to the secondary side of the transformer 120, rectifies and converts power output from the secondary side of the transformer 120, and outputs drive power of a plurality of load modules, in addition to the main board 200.

The main board 200 is connected to the secondary side power supply 130, operates by receiving drive power supplied from the secondary side power supply 130, and serves to control each module of the electronic device.

The load 300 is an operation module with which the electronic device is provided, and operates by receiving the drive power from the secondary side power supply 130. The load 300 may be configured in various ways according to the types of electronic devices. For example, the load 300 in a case of a display device such as a TV or a monitor may include a display module and a display driver, the load 300 in a case of a washing machine may include a washing tub drive unit, and the load 300 in a case of a refrigerator may include a compressor, a motor, and the like. The present disclosure is applicable to various home appliances provided with a power board 100 and a main board 200, for example, electronic devices such as TVs, monitors, washing machines, and refrigerators.

The fault detector 140 is provided in the primary side power supply 110 of the power board 100, and is connected to the main board 200 and the load 300, so as to detect fault states of the main board 200 and the load 300. The fault detector 140 may be implemented by including firmware that receives, as feedback, fault detection signals from the main board 200 and the load 300 and determines a fault state. The fault detector 140 may detect fault types or fault states for various modules and functions in response to the type of electronic device or the functions and operations of the main board 200 and the load 300. Meanwhile, the fault detector 140 may be configured to detect faults in other peripheral devices, which are connected to the electronic device, in addition to the main board 200 and the load 300.

Since the fault detector 140 is provided in the primary side power supply 110 of the power board 100, the fault detector 140 is configured to operate even when only a commercial power source, i.e., a power plug, is connected thereto from the outside. Accordingly, as long as commercial AC power is applied, even when power is not supplied to the secondary side power supply 130 or the main board 200, the electronic device according to the present disclosure may detect faults of the main board 200 and the load 300 through the fault detector 140 of the primary side power supply 110.

The power board 100 has two modes, i.e., a standby mode and a normal mode, and the power board 100 operates in the standby mode when commercial power is applied, and then the power board 100 operates in the normal mode by receiving a power-on signal from the main board 200 when a power switch is turned on, and accordingly the load 300 is operated by receiving the drive power supplied thereto. Since the electronic device according to the present disclosure is provided with the fault detector 140 in the primary side power supply 110, when only commercial power is applied regardless of the on/off state of the power switch, the electronic device may detect the types of faults or the states of the faults of the main board 200 and the load 300.

Figure 2:
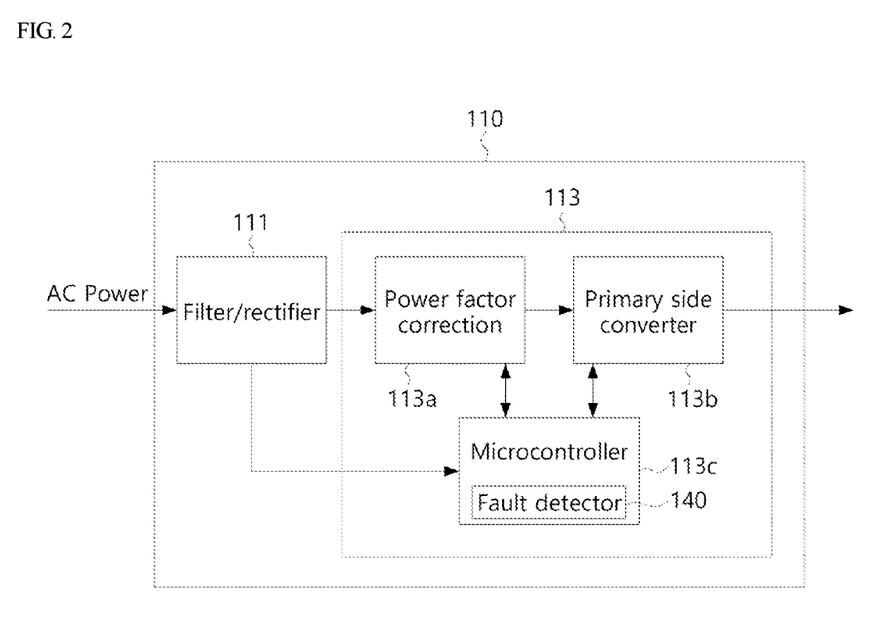
FIG. 2 is a block diagram illustrating an example of a primary side power supply of the electronic device according to the exemplary embodiment of the present disclosure.

FIG. 2 is a block diagram illustrating an example of the primary side power supply 110 of the electronic device according to the exemplary embodiment of the present disclosure. Referring to FIG. 2, the primary side power supply 110 of the electronic device having the self-diagnosis function according to the exemplary embodiment of the present disclosure includes: a filter/rectifier 111; and a digital power chip 113, and the digital power chip 113 includes a power factor correction 113*a*, a primary side converter 113*b*, and a microcontroller 113*c* (Micom).

The filter/rectifier 111 receives AC power input from the outside, removes electromagnetic interference (EMI) from the AC power, and then rectifies and outputs the AC power to the digital power chip 113. The filter/rectifier 111 may be configured to include a capacitor and a coil for removing noise from AC power, a bridge diode that performs a function of full-wave rectifying the AC power and converting the AC power into DC power, etc.

The power factor correction 113*a* is connected to an output terminal of the filter/rectifier 111 to compensate and output a power factor according to the waveform of an output voltage of the filter/rectifier 111.

The primary side converter 113*b* is connected to the power factor correction 113*a*, controls a primary side DC voltage output from the power factor correction 113*a* to be output as a secondary side voltage of the transformer 120, and may be implemented as an LLC resonant IC. The primary side converter 113b may be configured to include: a voltage compensation circuit that performs feedback control to keep the output voltage constant; and a current detection circuit that detects a resonance current of the primary winding side of the transformer 120.

The microcontroller 113c is for controlling the filter/rectifier 111 and the primary side converter 113b. The primary side power supply 110 according to the exemplary embodiment of the present disclosure is configured to include a digital power chip 113 for power control in digital method. The filter/rectifier 111, the primary side converter 113b, and a microcontroller 113c are provided in the digital power chip 113.

Meanwhile, the fault detector 140 may be provided in the microcontroller 113c of the digital power chip 113. The fault detector 140 may receive feedback on various fault detection levels or signals from the main board 200 and the load 300, and diagnose the fault types by using firmware. In addition, since the fault detector 140 may detect a fault even in a state in which power is not supplied to the secondary side of the power board 100, more various faults may be detected than the conventional fault detection method.

Specifically, the fault detector 140 is connected to the output terminal of the filter/rectifier 111 and operates by receiving power output through the filter/rectifier 111. When a power plug is connected and commercial AC power is applied, the power is supplied to the filter/rectifier 111 and digital power chip 113 to operate, and while the power plug is connected, the fault detector 140 may detect faults in the main board 200 and the load 300 irrespective of whether a power switch of the electronic device is turned on or off, or whether the main board 200 operates normally.

Referring back to FIG. 1, the electronic device according to the exemplary embodiment of the present disclosure may further include a fault indicator 400.

The fault indicator 400 outputs fault messages in response to a detection result of the fault detector 140. The fault indicator 400 includes at least one of a light-emitting device, a buzzer, and a speaker. The fault detector 140 monitors the states of the main board 200 and the load 300, and controls the number of outputs of the buzzer, the audio output sound of the speaker, and the number of light emission of the light-emitting device, for example, the number of flashes of light in response to fault states of the main board 200 and the load 300, thereby allowing the fault indicator 400 to output the fault message indicating the detected fault types or the detected fault states.

A plurality of fault states of the main board 200 and the load 300 may be classified. The fault messages are respectively output differently in response to the fault states of the main board 200 and the load 300, and a user may determine the fault states or fault content through the fault messages.

The fault indicator 400 operates by receiving power supplied from the primary side power supply 110. Accordingly, the electronic device according to the present disclosure is capable of detecting a fault state and outputting the fault messages even when the main board 200 is broken or is not in a normal state.

Meanwhile, the electronic device having the self-diagnosis function according to the exemplary embodiment of the present disclosure further includes an isolator 500 (not shown) configured to isolate the fault detection signals transmitted to the fault detector 140 from the load 300 and the main board 200. The isolator 500 is configured to solve the problem of a potential difference that occurs when a secondary side signal of the power board 100 is transmitted to the primary side thereof. The isolator 500 may be one or more photo couplers, transformers, relays, switches, and the like, but is not limited thereto, and includes all switch devices capable of transmitting signals between electrically isolated circuits.

Figure 3:
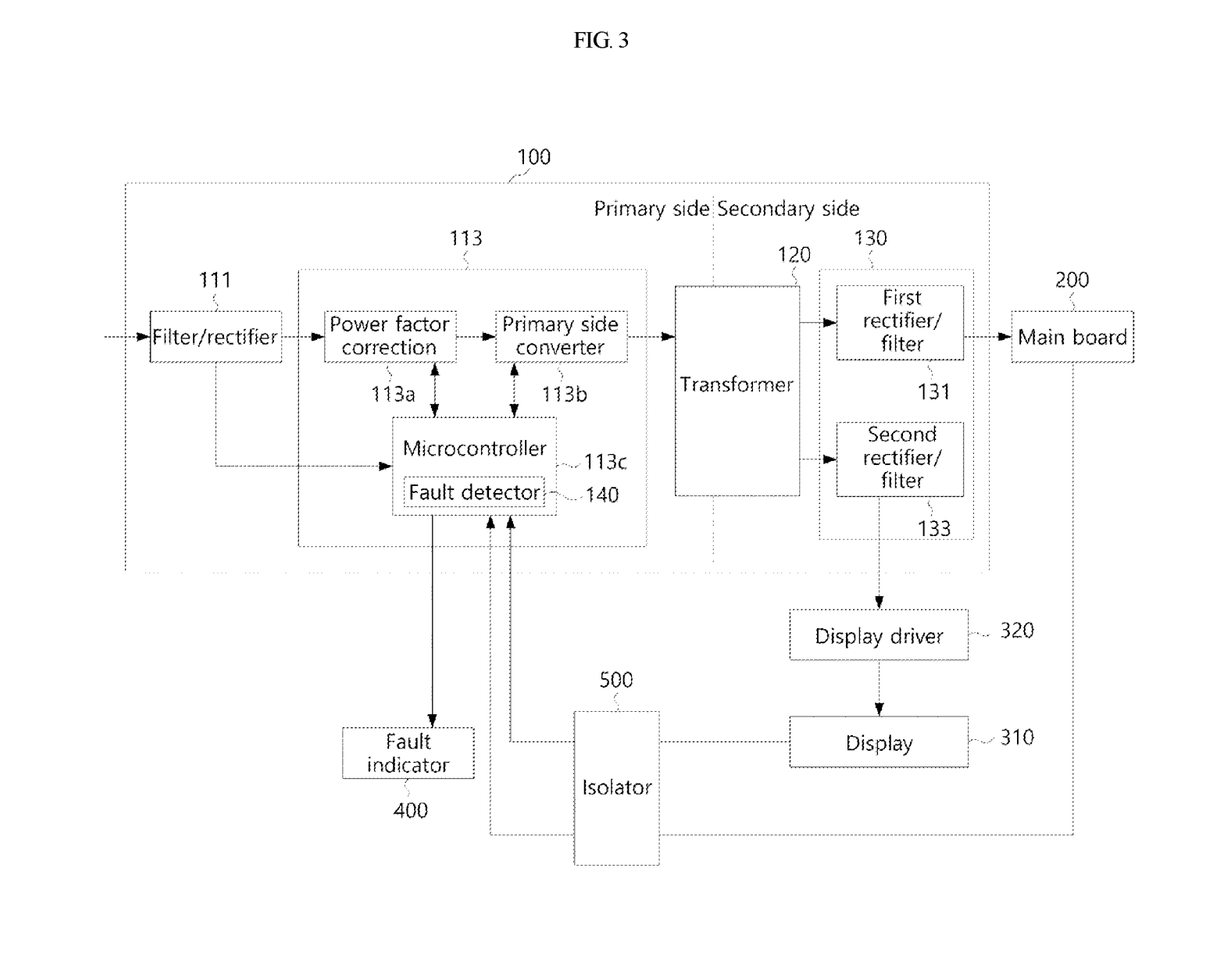
FIG. 3 is a block diagram illustrating an example of a display device having a self-diagnosis function according to the exemplary embodiment of the present disclosure.

FIG. 3 is a block diagram illustrating an example of the display device having the self-diagnosis function according to the exemplary embodiment of the present disclosure. A description overlapping with the above-described exemplary embodiment will be omitted when necessary.

Referring to FIG. 3, the display device having the self-diagnosis function according to the exemplary embodiment of the present disclosure includes a power board 100, a main board 200, a display 310, a display driver 320, a fault indicator 400, and an isolator 500.

The power board 100 includes the primary side power supply 110, the transformer 120, and the secondary side power supply 130, and in the primary side power supply 110, includes the filter/rectifier 111, the power factor correction 113a, the primary side converter 113b, and the fault detector 140. The power factor correction 113a, the primary side converter 113b, and the fault detector 140 may be provided in the digital power chip 113, and the fault detector 140 may be provided in the microcontroller 113c of the digital power chip 113.

The present exemplary embodiment is intended to describe an embodiment of the display device among electronic devices, and the load 300 includes the display 310 and the display driver 320.

The display 310 is for displaying an image, and may be implemented by a liquid crystal display (LCD) panel, an organic light-emitting diode (OLED) panel, a flexible display, a three-dimensional display (3D display), etc. The display driver 320 may generate a driving signal for driving the display 310 by using a DC voltage input from the secondary side power supply 130 and may supply the driving signal to a display panel.

When external AC power is input, the AC power undergoes EMI filtering and rectification in the filter/rectifier 111, and then is input to the fault detector 140 and the power factor correction 113a of the digital power chip 113. The power factor correction 113a compensates and outputs the power factor according to the waveform of an output voltage, and the primary side converter 113b controls a primary side DC voltage of the power factor correction 113a, so as to be output as the secondary side voltage of the transformer 120. The secondary side power supply 130 receives the step-down power output from the secondary side of the transformer 120 and supplies the power to the main board 200 after undergoing rectification and conversion. Referring to FIG. 3, the secondary side power supply 130 includes: a first rectifier/filter 131 for supplying the drive power to the main board 200; and a second rectifier/filter 133 for supplying the drive power to the display driver 320.

When a power switch of the display device is turned on, the main board 200 outputs a power-on signal to the primary side power supply 110, and while the power board 100 that was in the standby mode operates in the normal mode, the drive power is supplied to the display driver 320 from the second rectifier/filter 133 of the secondary side power supply 130, so that the display 310 is operated.

Since the fault detector 140 is provided in the primary side power supply 110 and operates in a state in which external commercial power is applied, the fault detector 140 may detect fault states of the main board 200, the display 310, and the display driver 320, regardless of whether the power switch of the display device is turned on or off, or whether the secondary side power supply 130 is supplied with power.

The fault detector 140 controls the fault indicator 400 to output the fault messages indicating the fault types or the fault states in response to the fault detection results of the main board 200, the display 310, and the display driver 320. In the present exemplary embodiment, it will be described as an example that the fault indicator 400 is implemented by using a light-emitting device such as an LED.

Figure 4:
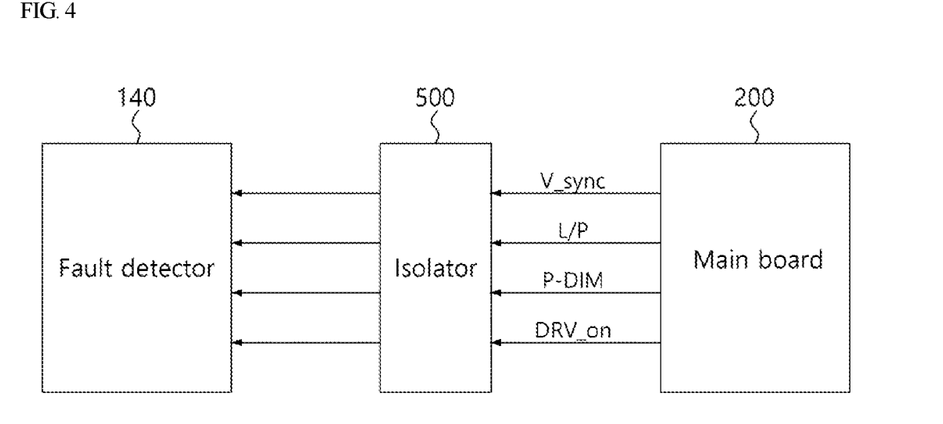
FIGS. 4 and 5 are schematic diagrams for describing methods of respectively detecting faults in a load and a main board in the display device having the self-diagnosis function according to the exemplary embodiment of the present disclosure.
Figure 5:
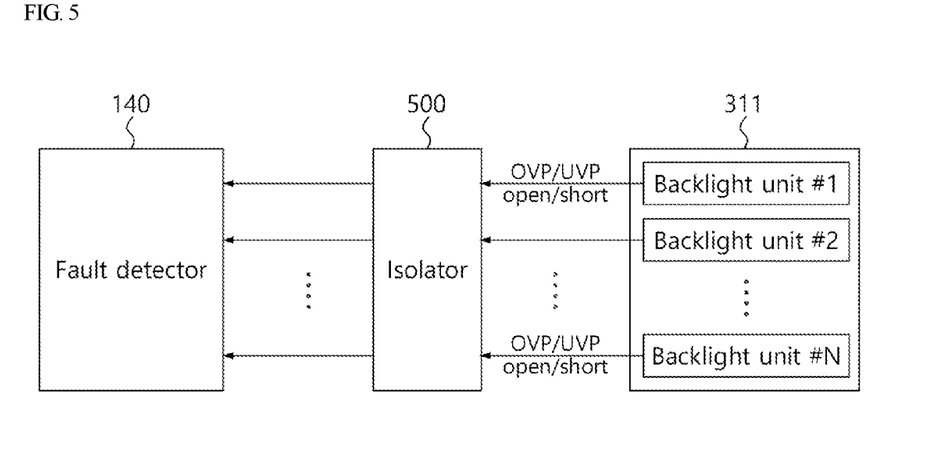

FIGS. 4 and 5 are schematic diagrams for describing methods of respectively detecting faults of the load 300 and the main board 200 in the display device in FIG. 3. FIG. 4 is a view for describing an example in which the display 310 includes LED backlight parts 311 and the fault detector 140 detects a fault state of each backlight unit 311.

Referring to FIGS. 4 and 5, fault detection signals from the load 300 and the main board 200 are transmitted, as feedback, to the fault detector 140 through the isolator 500. The signals of the load 300 and the main board 200 and the signals of the fault detector 140 are respectively secondary signals and primary signals, and since a potential difference occurs therebetween, it is configured such that the signals are transmitted through the isolator 500.

Figure 6:
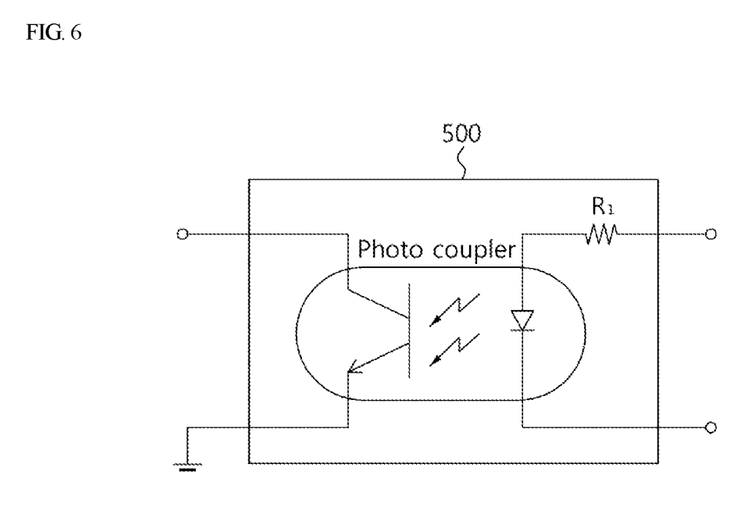
FIG. 6 is a view illustrating an example of an isolator of the electronic device according to the exemplary embodiment of the present disclosure.

FIG. 6 is a view illustrating an example of the isolator 500 according to the exemplary embodiment of the present disclosure. Referring to FIG. 6, the isolator 500 is composed of a circuit including a photo coupler, and the fault detection signals from the load 300 and the main board 200 pass through the isolator 500 and are transmitted, as feedback, to the fault detector 140.

Referring back to FIG. 4, the fault detector 140 detects the presence or absence of over voltage protection (OVP) and under voltage protection (UVP) of a voltage level of each backlight unit 311, and controls the fault indicator 400 to output a first fault message. The fault detector 140 presets a normal value of the voltage level of each backlight unit 311 by software, and detects the voltage level as OVP when the voltage level is higher than a corresponding range, and detects the voltage level as UVP when the voltage level is lower than the corresponding range. As an example, in the first fault message, the LED light-emitting device flashes once. When the LED light-emitting device flashes once, a user may recognize that the voltage of a particular backlight unit 311 is faulty due to an OVP state or a UVP state.

The fault detector 140 monitors a voltage level of a dimming Field Effect Transistor (FET) drain terminal of each backlight unit 311, and when a state in which the corresponding voltage level is higher than a predetermined level is maintained for a predetermined period of time, the fault detector 140 detects the voltage level as an open level, so as to control the fault indicator 400 to output a second fault message.

Whereas when a state in which the voltage level of the dimming FET drain terminal of each backlight unit 311 is lower than the predetermined level is maintained for the predetermined period of time, the fault detector 140 detects the voltage level as a short level, so as to control the fault indicator 400 to output a third fault message.

As an example, in the second fault message, the LED light-emitting device flashes twice, and in the third fault message, the LED light-emitting device flashes three times. A user may recognize that the LED backlight unit 311 is faulty due to an open LED protection state when the LED light-emitting device flashes twice, and the LED backlight unit 311 is faulty due to a short LED protection state when the LED light-emitting device flashes three times.

Referring to FIG. 5, the fault detector 140 monitors a driver-on (DRV_on) signal (about 3.3V) of the main board 200, and when the driver-on signal is not input, the fault detector 140 detects this case as a fault of not applying the driver-on signal. The fault detector 140 controls the fault indicator 400 to output a fourth fault message indicating a fault state of not applying the driver-on signal. As an example, in a fourth fault message, the LED light-emitting device flashes four times. When the LED light-emitting device flashes four times, the user may recognize that the driver-on signal of the main board 200 is faulty.

The fault detector 140 monitors a pulse width modulation (PWM) signal of the main board 200, and controls the fault indicator 400 to output a fifth fault message when the PWM signal of the main board 200 is not applied for a predetermined period of time. The PWM signal of the main board 200 indicates the overall brightness of the backlights, and the brightness is controlled by PWM duty. When the PWM signal is not applied for the predetermined period of time, the fault detector 140 detects this case as a PWM dimming fault (P-DIM). As an example, in the fifth fault message, the LED light-emitting device flashes five times. When the LED light-emitting device flashes five times, the user may recognize that the PWM dimming of the main board 200 is faulty.

The fault detector 140 detects a serial peripheral interface (SPI) signal of the main board 200, and controls the fault indicator 400 to output a sixth fault message when the SPI signal deviates from the rules of local data (L/D). The fault detector 140 determines the rules of L/D data by using SPI signals, and then detects a fault when a SPI signal deviates from the rules. The fault detector 140 checks a check sum or a data length of local data and detects a local dimming data fault when the check sum or the data length deviates from the rules. As an example, in the sixth fault message, the LED light-emitting device flashes six times. When the LED light-emitting device flashes six times, the user may recognize that the local dimming data of the main board 200 is faulty.

The fault detector 140 monitors a vertical synchronization signal (V-sync) of the main board 200, and controls the fault indicator 400 to output a seventh fault message when the vertical synchronization signal is not applied for a predetermined period of time or out of a preset frequency range. When the vertical synchronization signal (V-sync) of the main board 200 is not applied, the fault detector 140 detects this case as a fault of not applying the vertical synchronization signal. As an example, in the seventh fault message, the LED light-emitting device flashes seven times. When the LED light-emitting device flashes four times, the user may recognize that the vertical synchronization signal of the main board 200 is faulty.

As described above, in the electronic device having the self-diagnosis function according to the present disclosure, the fault detector 140 is provided in the primary side power supply 110 of the power board 100, so that as long as in a state where the power plug is plugged in, even when power is not supplied to the secondary side power supply 130, faults in the main board 200 and the load 300 may be detected, and in particular, even when the power is not supplied to the main board 200 or the main board 200 does not operate normally, the faults in the main board 200 or the load 300 may be detected.

Meanwhile, the operating method of the electronic device of the present disclosure may be implemented as a processor-readable code on a processor-readable recording medium provided in the electronic device. The processor-readable recording medium includes all types of recording devices in which data readable by the processor is stored. Examples of the processor-readable recording medium include ROM, RAM, CD-ROM, magnetic tape, floppy disk, optical data storage device, and the like, and also includes those implemented in the form of carrier waves such as transmission over the Internet. In addition, the processor-readable recording medium is distributed in a computer system connected to a network, so that the processor-readable code may be stored and executed in a distributed method.

In addition, in the above, the preferred exemplary embodiments of the present disclosure have been illustrated and described, but the present disclosure is not limited to the specific exemplary embodiments described above. In the present disclosure, various modifications may be possible by those skilled in the art to which the present disclosure belongs without departing from the spirit of the present disclosure claimed in the claims, and these modifications should not be understood individually from the technical ideas or prospect of the present disclosure.

What is claimed:

1. An electronic device having a self-diagnosis function, the electronic device comprising:
a power board comprising a transformer configured to convert power input to a primary side thereof into a predetermined magnitude and output the power to a secondary side thereof, a primary side power supply configured to convert alternating current power input from outside and apply the converted alternating current power to the primary side of the transformer, and a secondary side power supply configured to be connected to the secondary side of the transformer, rectify power output from the secondary side, and output the rectified power;
a main board connected to the secondary power supply and configured to operate by receiving power supplied from the secondary power supply;
a load connected to the secondary power supply and configured to operate by receiving the power supplied from the secondary power supply; and
a fault detector provided in the primary side power supply and configured to detect fault states of the main board and the load.

2. The electronic device of claim 1, wherein the fault detector is provided in a digital power chip.

3. The electronic device of claim 2, wherein the primary side power supply further comprises a filter/rectifier configured to receive the alternating current power input from the outside, remove noise from the alternating current power, rectify the alternating current power, and output the alternating current power to the digital power chip, and
the fault detector is connected to an output terminal of the filter/rectifier and configured to operate by receiving power output from the filter/rectifier.

4. The electronic device of claim 3, wherein the digital power chip comprises:
a power factor correction connected to the output terminal of the filter/rectifier and configured to correct a power factor of the power output from the filter/rectifier;
a primary side converter connected to an output terminal of the power factor correction, and configured to convert power output from the power factor correction and apply the converted power to the primary side of the transformer; and
a microcontroller, and
the fault detector is provided in the microcontroller.

5. The electronic device of claim 4, further comprising:
a fault indicator connected to the fault detector and configured to output fault messages in response to detection results of the fault detector.

6. The electronic device of claim 1, further comprising:
an isolator configured to isolate fault detection signals transmitted from the main board and the load to the fault detector.

7. The electronic device of claim 5, wherein the electronic device is a display device,
the load comprises:
a display; and
a display driver connected to the secondary side power supply and configured to receive drive power supplied from the secondary side power supply and drive the display, and
the fault detector is configured to detect the fault states of the display and control the fault indicator to output the fault messages in response to the detected fault states.

8. The electronic device of claim 7, wherein the display comprises backlight units, and
the fault detector is configured to detect presence or absence of OVP and UVP of a voltage level of the backlight units and control the fault indicator to output a first fault message.

9. The electronic device of claim 7, wherein the display comprises backlight units, and
when a state in which a voltage level of a field effect transistor drain terminal of each of the backlight units is higher than a predetermined level is maintained for a predetermined period of time, the fault detector is configured to detect the voltage level as an open level, so as to control the fault indicator to output a second fault message.

10. The electronic device of claim 7, wherein the display comprises backlight units, and
when a state in which a voltage level of a field effect transistor drain terminal of each of the backlight units is lower than a predetermined level is maintained for a predetermined period of time, the fault detector is configured to detect the voltage level as a short level, so as to control the fault indicator to output a third fault message.

11. The electronic device of claim 7, wherein the fault detector is configured to monitor a driver-on signal of the main board, and control the fault indicator to output a fourth fault message when the driver-on signal is not applied.

12. The electronic device of claim 7, wherein the fault detector is configured to monitor a PWM signal of the main board, and controls the fault indicator to output a fifth fault message when the PWM signal of the main board is not applied for a predetermined period of time.

13. The electronic device of claim 7, wherein the fault detector is configured to monitor a serial peripheral interface (SPI) of the main board, and controls the fault indicator to output a sixth fault message when the SPI signal deviates rules of local data.

14. The electronic device of claim 7, wherein the fault detector is configured to monitor a vertical synchronization signal of the main board, and controls the fault indicator to output a seventh fault message when the vertical synchronization signal is not applied for a predetermined period of time or deviates a preset frequency range.

15. The electronic device of claim 7, wherein the fault indicator comprises at least one of a light-emitting device, a buzzer, and a speaker, and the fault detector is configured to control at least one of the number of light flashes of the light-emitting device, the number of outputs of the buzzer, and output sound of the speaker, so as to output the fault messages in response to the detected fault states.

16. The electronic device of claim 8, wherein the fault indicator comprises at least one of a light-emitting device, a buzzer, and a speaker, and
the fault detector is configured to control at least one of the number of light flashes of the light-emitting device, the number of outputs of the buzzer, and output sound of the speaker, so as to output the fault messages in response to the detected fault states.

17. The electronic device of claim 9, wherein the fault indicator comprises at least one of a light-emitting device, a buzzer, and a speaker, and
the fault detector is configured to control at least one of the number of light flashes of the light-emitting device, the number of outputs of the buzzer, and output sound of the speaker, so as to output the fault messages in response to the detected fault states.

18. The electronic device of claim 10, wherein the fault indicator comprises at least one of a light-emitting device, a buzzer, and a speaker, and
the fault detector is configured to control at least one of the number of light flashes of the light-emitting device, the number of outputs of the buzzer, and output sound of the speaker, so as to output the fault messages in response to the detected fault states.

19. The electronic device of claim 11, wherein the fault indicator comprises at least one of a light-emitting device, a buzzer, and a speaker, and
the fault detector is configured to control at least one of the number of light flashes of the light-emitting device, the number of outputs of the buzzer, and output sound of the speaker, so as to output the fault messages in response to the detected fault states.

20. The electronic device of claim 12, wherein the fault indicator comprises at least one of a light-emitting device, a buzzer, and a speaker, and
the fault detector is configured to control at least one of the number of light flashes of the light-emitting device, the number of outputs of the buzzer, and output sound of the speaker, so as to output the fault messages in response to the detected fault states.

* * * * *